(12) United States Patent
Nahar et al.

(10) Patent No.: US 10,923,593 B1
(45) Date of Patent: Feb. 16, 2021

(54) TRANSISTOR AND METHODS OF FORMING TRANSISTORS

(71) Applicant: Micron Technology, Inc., Boise, ID (US)

(72) Inventors: Manuj Nahar, Boise, ID (US); Vassil N. Antonov, Boise, ID (US); Darwin Franseda Fan, Boise, ID (US); Ali Moballegh, Chandler, AZ (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/536,479

(22) Filed: Aug. 9, 2019

(51) Int. Cl.
| | |
|---|---|
| *H01L 29/78* | (2006.01) |
| *H01L 27/108* | (2006.01) |
| *H01L 29/66* | (2006.01) |
| *H01L 21/02* | (2006.01) |
| *H01L 29/04* | (2006.01) |

(52) U.S. Cl.
CPC .... *H01L 29/7841* (2013.01); *H01L 21/02686* (2013.01); *H01L 27/10802* (2013.01); *H01L 29/04* (2013.01); *H01L 29/66666* (2013.01); *H01L 29/7827* (2013.01)

(58) Field of Classification Search
CPC .......... H01L 29/7841; H01L 29/04; H01L 29/66666; H01L 29/7827; H01L 21/02686; H01L 27/10802
See application file for complete search history.

(56) References Cited

U.S. PATENT DOCUMENTS

| | | | |
|---|---|---|---|
| 8,513,722 B2 * | 8/2013 | Tang | H01L 21/845 257/296 |
| 9,646,869 B2 * | 5/2017 | Tang | H01L 29/861 |
| 2019/0013196 A1 * | 1/2019 | Roberts | H01L 21/02381 |

OTHER PUBLICATIONS

U.S. Appl. No. 16/986,436, filed Aug. 6, 2020 by Nahar et al.
U.S. Appl. No. 16/536,544, filed Aug. 9, 2019 by Nahar et al.
U.S. Appl. No. 16/536,590, filed Aug. 9, 2019 by Liu et al.

* cited by examiner

*Primary Examiner* — Victor A Mandala
(74) *Attorney, Agent, or Firm* — Wells St. John P.S.

(57) ABSTRACT

A transistor comprises a top source/drain region, a bottom source/drain region, a channel region vertically between the top and bottom source/drain regions, and a gate operatively laterally-adjacent the channel region. An upper material is directly above a lower material. The upper material is in at least one of the top source/drain region, the bottom source/drain region, and the channel region. The lower material is in at least one of the top source/drain region, the bottom source/drain region, and the channel region. The upper material comprises 1 atomic percent to 10 atomic percent elemental-form H and 0 total atomic percent to less than 0.1 total atomic percent of one or more noble elements. The lower material comprises 0 atomic percent to less than 1 atomic percent elemental-form H and 0.1 total atomic percent to 10 total atomic percent of one or more noble elements. Other embodiments, including method, are disclosed.

31 Claims, 7 Drawing Sheets

TRANSISTOR AND METHODS OF FORMING TRANSISTORS

TECHNICAL FIELD

Embodiments disclosed herein pertain to transistors and to methods of forming transistors.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated therefrom by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Field effect transistors are of course also used in integrated circuitry other than and/or outside of memory circuitry.

DETAILED DESCRIPTION OF EXAMPLE EMBODIMENTS

Figure 1:
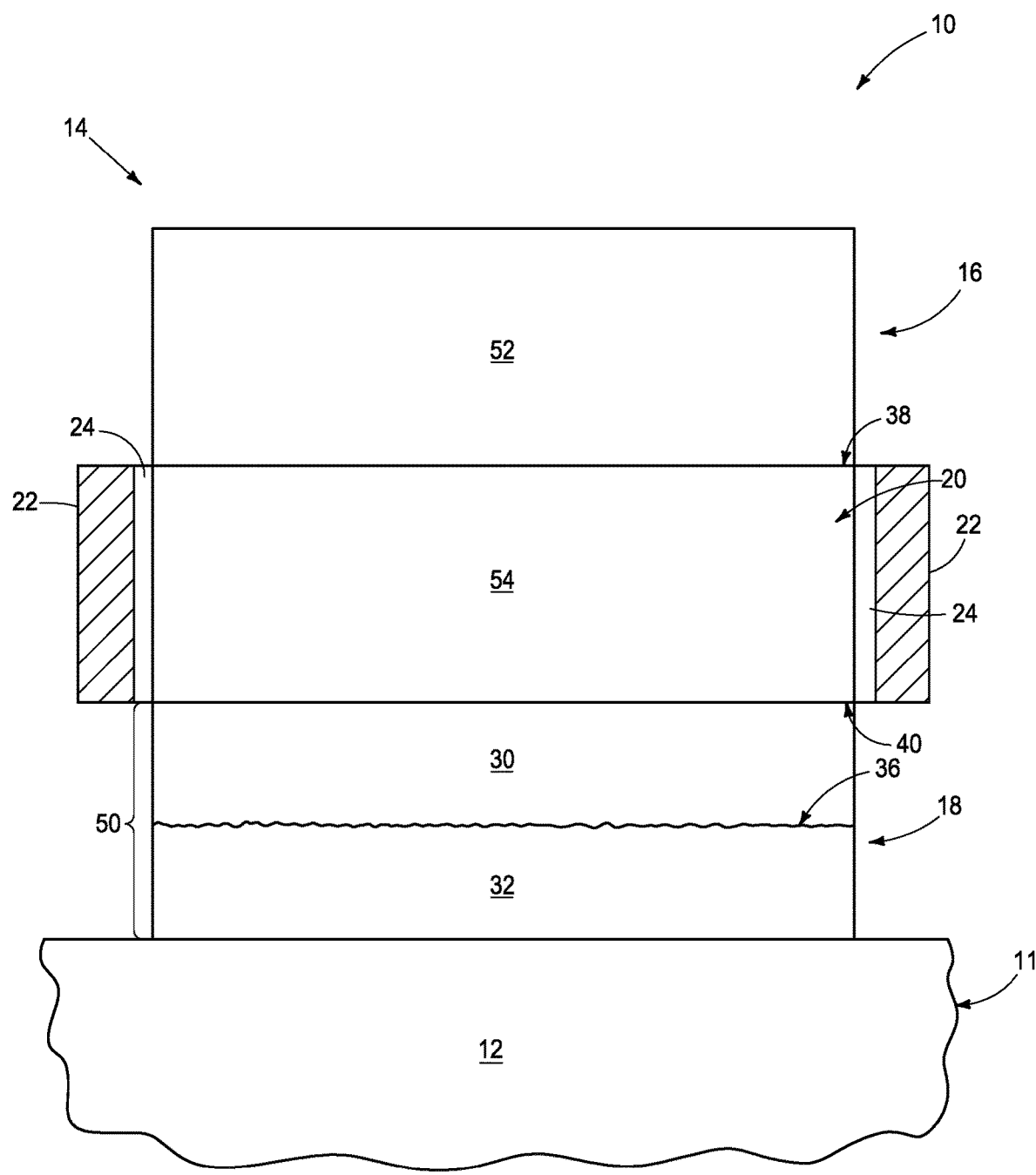
FIG. 1 is a diagrammatic sectional view of a transistor in accordance with an embodiment of the invention.

Embodiments of the invention encompass methods of forming one or more transistors and one or more transistors independent of method of manufacture. Transistors manufactured in accordance with method embodiments may have any of the attributes as described herein in structure embodiments. A first example transistor 14 in accordance with an embodiment of the invention as part of a construction 10 is shown in FIG. 1. Construction 10 comprises a base substrate 11 having any one or more of conductive/conductor/conducting, semiconductive/semiconductor/semiconducting, or insulative/insulator/insulating (i.e., electrically herein) material(s) 12. Various materials have been formed elevationally over base substrate 11. Materials may be aside, elevationally inward, or elevationally outward of the FIG. 1-depicted materials. For example, other partially or wholly fabricated components of integrated circuitry may be provided somewhere above, about, or within base substrate 11. Only one transistor 14 is shown, although construction 10 may comprise multiple of the same or different construction transistors, for example fabricated in an array which includes one or more transistors in accordance with the invention.

Transistor 14 comprises a top source/drain region 16, a bottom source/drain region 18, a channel region 20 vertically between top and bottom source/drain regions 16, 18, respectively, and a gate 22 (i.e., conductive material) operatively laterally-adjacent channel region 20. A gate insulator 24 (e.g., silicon dioxide and/or silicon nitride) is between gate 22 and channel region 20. The example depicted components for brevity and clarity are only shown in FIG. 1 as a vertical cross-section. The example source/drain regions and channel regions may be, for example, in the form of coextensive longitudinally elongated lines running into and out of the plane of the page upon which FIG. 1 lies. Alternately, and by way of example only, such may be circular, rectangular, elliptical, triangular, etc. in horizontal cross-section (not shown). Gate insulator 24 and/or gate 22 may peripherally encircle such structures or alternately, by way of example only, be only partially around such structures or only on one lateral-side in vertical cross-section (not shown). Top source/drain region 16 and channel region 20 may be considered as having a top interface 38 and bottom source/drain region 18 and channel region 20 may be considered as having a bottom interface 40. Interfaces 38 and/or 40 are shown as being flat and horizontal, although other oriented interfaces may be used, for example diagonal, a jagged and/or undulating interface, a combination of straight and curved segments, etc. By way of examples only, regions 16, 18, and 20 may comprise one or more of elemental-form silicon, elemental-form germanium, a mixture of silicon and germanium, etc.

Top source/drain region 16, bottom source/drain region 18, and channel region 20, respectively, ideally have crystal grains and grain boundaries there-between (neither being shown). Ideally, such regions are each entirely crystalline. In this document, "crystalline" not immediately preceded by a numerical percentage or other quantifying adjective(s) is a material, region, and/or structure that is at least 90% by volume crystalline (i.e., having at least 90% by volume crystal grains). Two or three of regions 16, 18, 20 may have the same or different average crystal grain size(s) (i.e., volumetric) relative one another.

The transistor comprises an upper material directly above a lower material. Ideally, the upper material is directly against the lower material. The upper material is in at least one of the top source/drain region, the bottom source/drain region, and the channel region. The lower material is also in at least one of the top source/drain region, the bottom source/drain region, and the channel region. In one embodiment, the upper and lower materials are in the same one of the top source/drain region, the bottom source/drain region, and the channel region. In another embodiment, the upper and lower materials are in different ones of the top source/drain region, the bottom source/drain region, and the channel region. In one embodiment, each of the upper and lower materials has a maximum thickness of 50 Angstroms to 2,000 Angstroms. In one embodiment, the lower material has a lower maximum thickness than the upper material.

Figure 2:
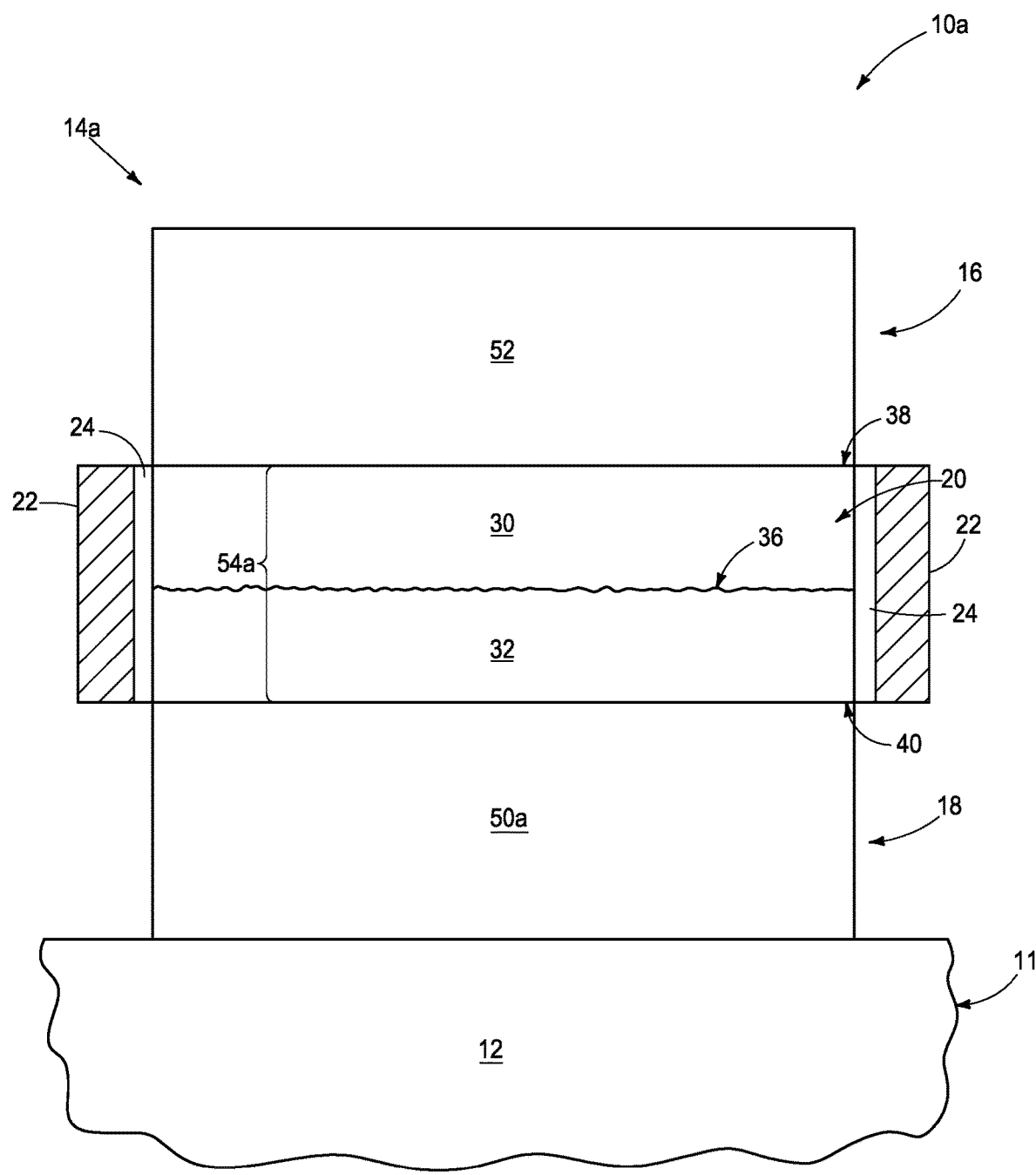
FIG. 2 is a diagrammatic sectional view of a transistor in accordance with an embodiment of the invention.
Figure 3:
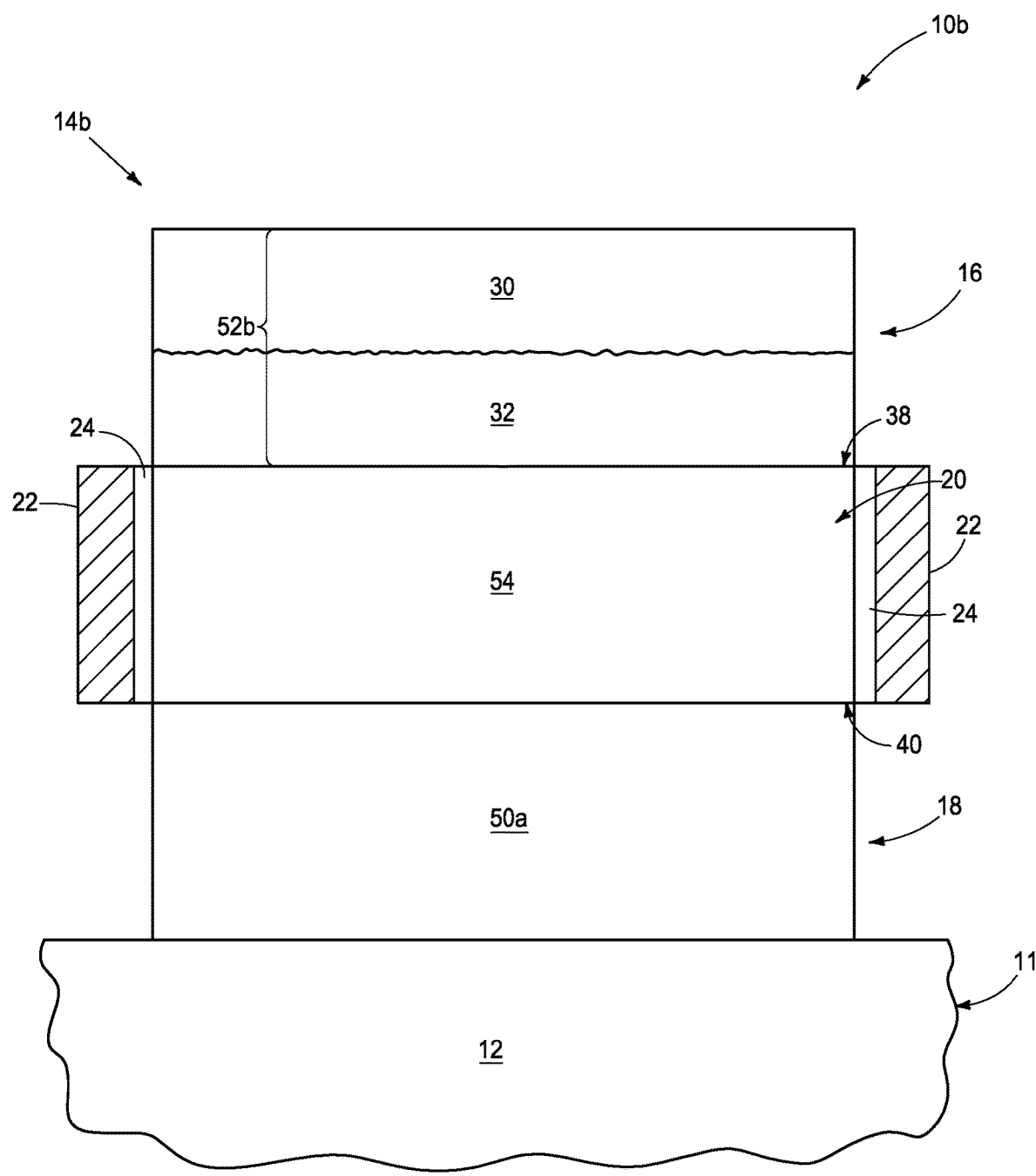
FIG. 3 is a diagrammatic sectional view of a transistor in accordance with an embodiment of the invention.

FIG. 1 shows as example embodiment wherein top source/drain region 16 comprises material 52, channel region 20 comprises material 54, and bottom source/drain region comprises material 50, with material 50 comprising upper material 30 and lower material 32 (as referred to above). Example upper material 30 and lower material 32 are directly against one another along a continuous interface 36. Alternately, upper material 30 and lower material 32 may not be continuously directly against one another all across the depicted cross-section (not shown) or not be directly against one another (not shown). Regardless, any of materials 52, 54, and 50 may be undoped or doped with a conductivity-modifying dopant (e.g., phosphorus, arsenic, etc.). Example primary materials for each of materials 52, 54, and 50 include monocrystalline or polycrystalline silicon, including a such materials as a mixture and/or alloy with germanium. Other characteristics of upper material 30 and lower material 32 in accordance with different embodiments of the invention are described below FIG. 1 shows as example embodiment where upper material 30 and lower material 32 are in bottom source/drain region 18. FIG. 2 shows an example alternate embodiment construction 10a comprising a transistor 14a where upper material 30 and lower material 32 comprise material 54a of channel region 20 and bottom source/drain region 18 comprises material 50a. Like numerals from the above-described embodiments have been used where appropriate, with some construction differences being indicated with the suffix "a". FIG. 3 shows another example alternate embodiment construction 10b comprising a transistor 14b where upper material 30 and lower material 32 comprise material 52b in top source/drain region 16. Like numerals from the above-described embodiments have been used where appropriate, with some construction differences being indicated with the suffix "b". Any other attribute(s) or aspect(s) as shown and/or described herein with respect to other embodiments may be used in the embodiment of FIGS. 2 and 3.

FIGS. 1-3 show embodiments wherein upper material 30 and lower material 32 are only in one of top source/drain region 16, bottom source/drain region 18, and channel region 20. Alternately, such may be in any two or in all three of top source/drain region 16, bottom source/drain region 18, and channel region 20.

Figure 4:
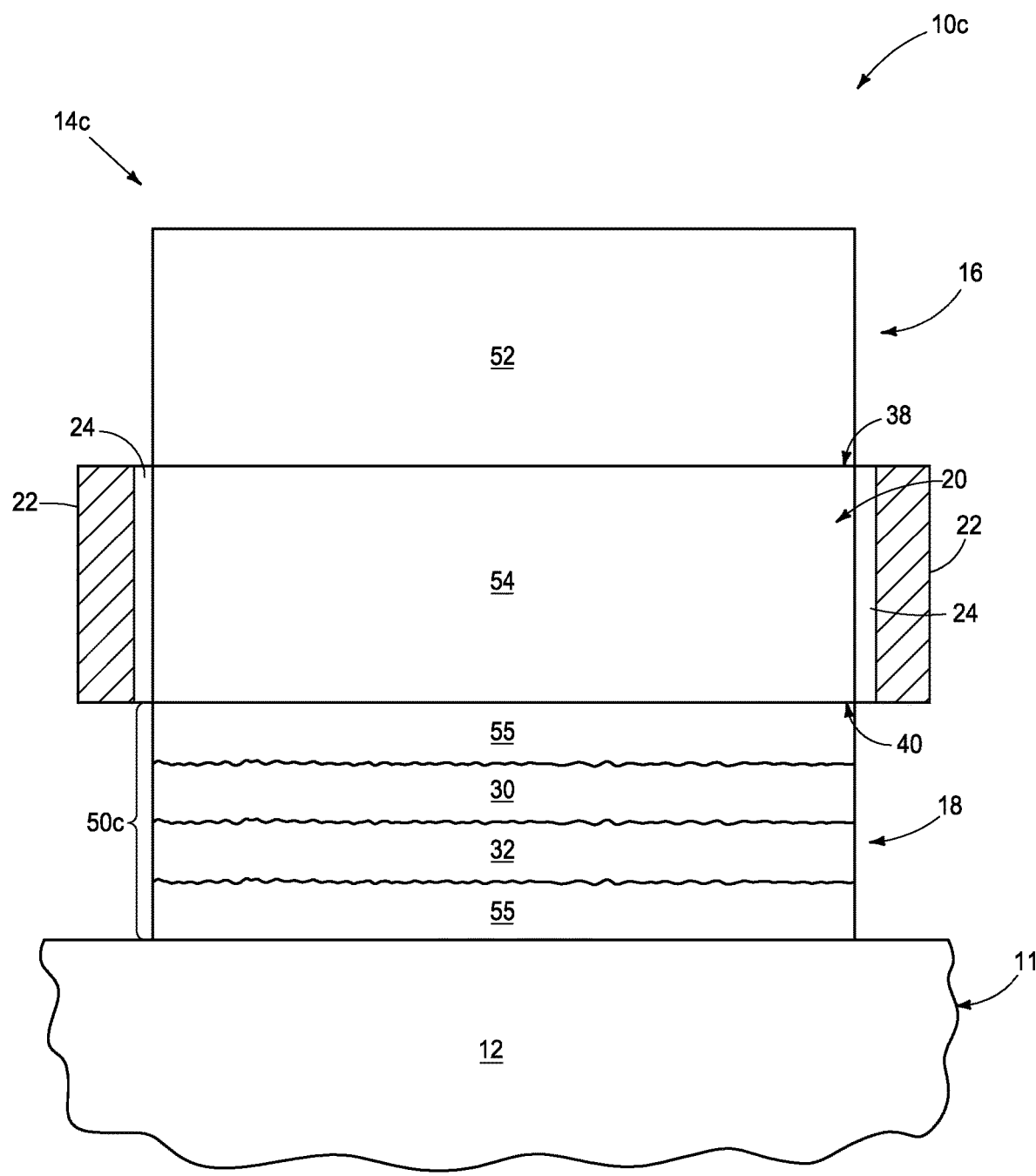
FIG. 4 is a diagrammatic sectional view of a transistor in accordance with an embodiment of the invention.

FIG. 4 shows an alternate embodiment construction 10c comprising a transistor 14c. Like numerals from the above-described embodiments have been used where appropriate, with some construction differences being indicated with the suffix "c" or different numerals. By way of example only, FIG. 4 shows an embodiment where upper material 30 and lower material 32 are in the same one of the top source/drain region, the bottom source/drain region, and the channel region (in bottom source/drain region 18 as shown) but do not encompass all of the thickness of such same one region. As an example, FIG. 4 shows bottom source/drain region 18 as comprising material 50c wherein upper material 30 and lower material 32 are sandwiched between an upper material 55 and a lower material 55 (e.g., doped semiconductor material). Example relationship of materials 55, 30, and 32 could alternately or additionally be in either or both of channel region 20 and top source/drain region 16.

Figure 5:
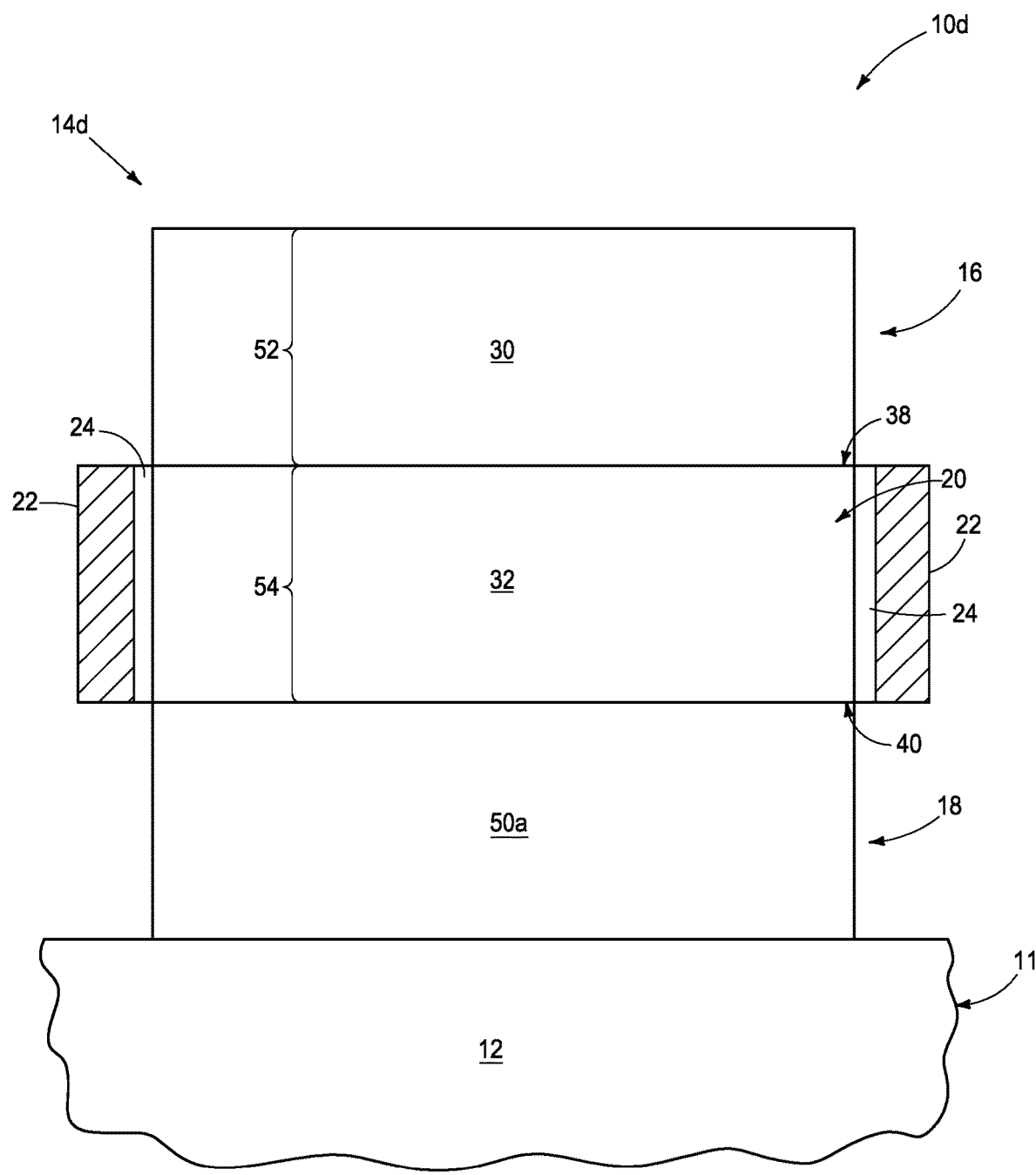
FIG. 5 is a diagrammatic sectional view of a transistor in accordance with an embodiment of the invention.
Figure 6:
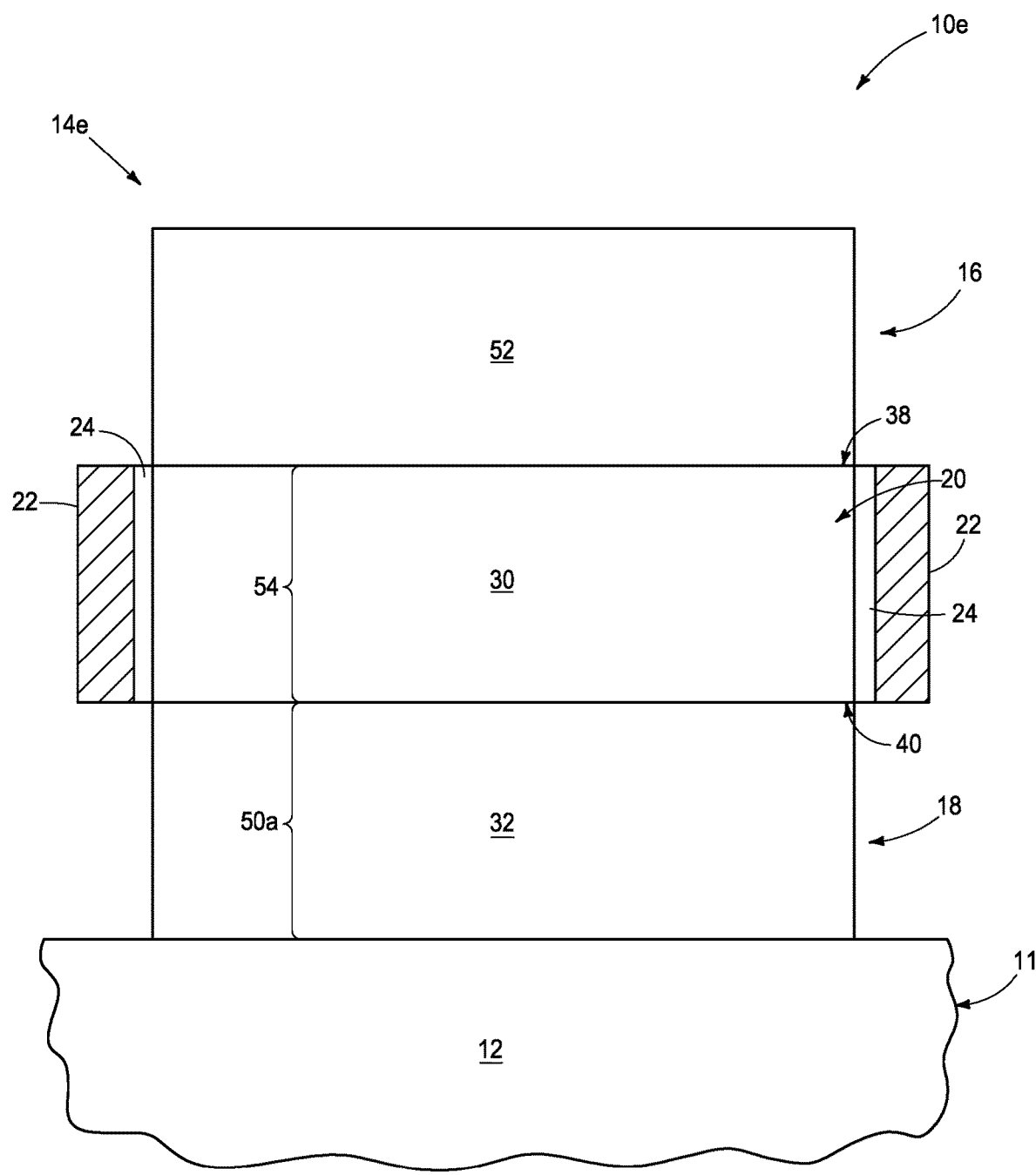
FIG. 6 is a diagrammatic sectional view of a transistor in accordance with an embodiment of the invention.

FIG. 5 shows an example alternate embodiment construction 10d of a transistor 14d where upper material 30 encompasses all of top source/drain region 16 and lower material 32 encompasses all of channel region 20. Like numerals from the above-described embodiments have been used where appropriate, with some construction differences being indicated with the suffix "d". FIG. 6 shows another example alternate construction 10e comprising a transistor 14e where upper material 30 is encompassed in channel region 20 and lower material 32 is encompassed in bottom source/drain region 18. Like numerals from the above-described embodiments have been used where appropriate, with some construction differences being indicated with the suffix "e". Any other attribute(s) or aspect(s) as shown and/or described herein with respect to other embodiments may be used in the embodiment of FIGS. 5 and 6.

Figure 7:
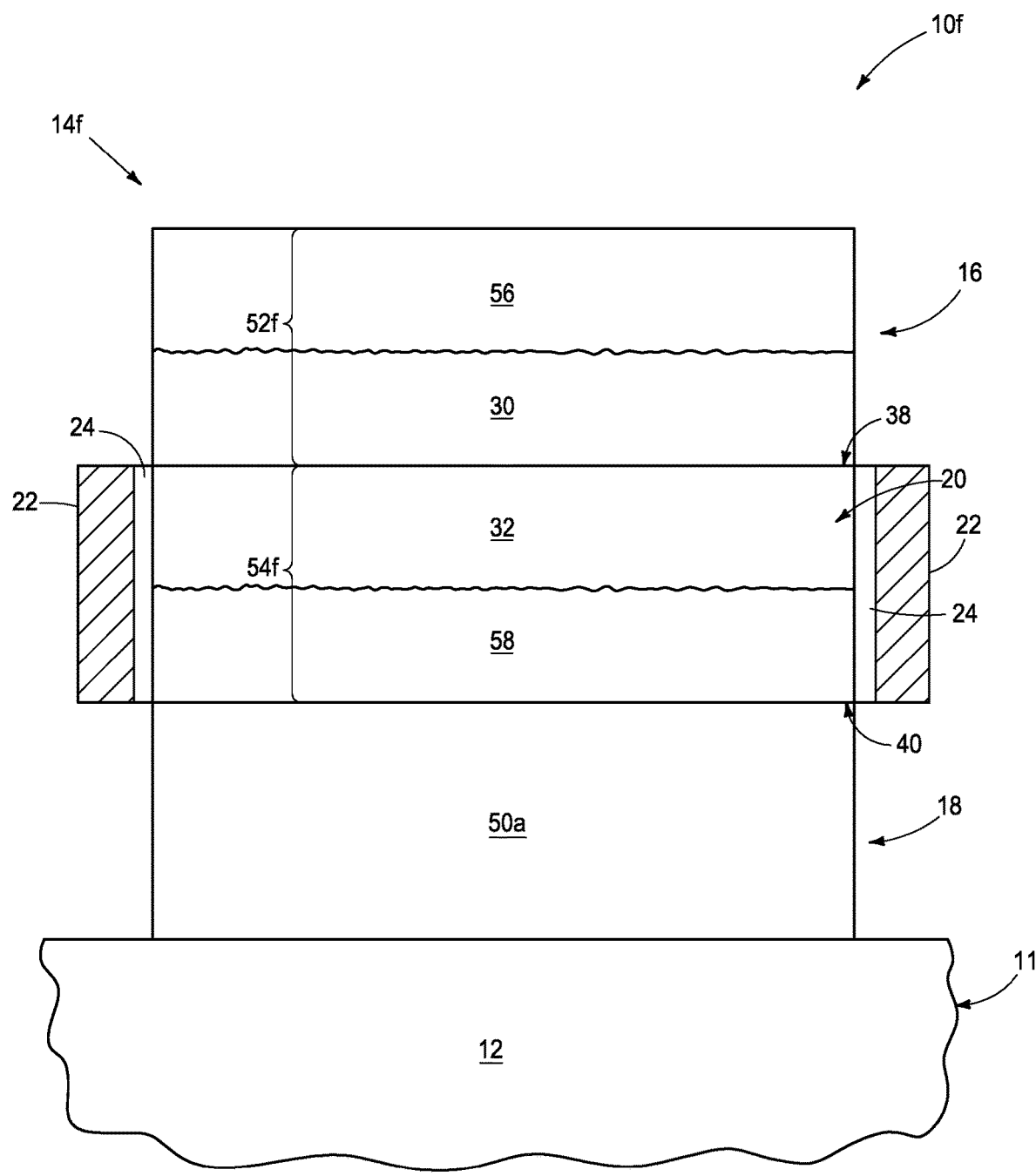
FIG. 7 is a diagrammatic sectional view of a transistor in accordance with an embodiment of the invention.

FIG. 7 shows another example alternate embodiment construction 10f comprising a transistor 14f. Like numerals from the above-described embodiments have been used where appropriate, with some construction differences being indicated with the suffix "f" or with different numerals. Example transistor 14f has upper material 30 in a bottom of top source/drain region 16 and lower material 32 in a top of channel region 20. Example material 52f of top source/drain region 16 comprises material 56 (e.g., doped semiconductor material) atop upper material 30 and material 54f of channel region 20 comprises lower material 32 atop a suitable material 58 (e.g., doped or undoped semiconductor material). As an alternate example, materials 30 and 32 could be in the bottom of channel region 20 and the top of bottom source/drain region 18, respectively (not shown). Further and regardless, any interface 36 between materials 30 and 32 need not coincide with interfaces 38 and 40.

In one embodiment, upper material 30 comprises 1 atomic percent to 10 atomic percent elemental-form H and 0 total atomic percent to less than 0.1 total atomic percent of one or more noble elements (i.e., any of He, Ne, Ar, Dr, Xe, Rn, and Og), and lower material 32 comprises 0 atomic percent to less than 1 atomic percent elemental-form H and 0.1 total atomic percent to 10 total atomic percent of one or more noble elements. In one such embodiment, upper material 30 comprises 1 atomic percent to 4 atomic percent elemental-form H (in one embodiment no more than $1 \times 10^{-6}$ total atoms of elemental-form H) and in one embodiment comprises 0 total atomic percent to no more than $1 \times 10^{-6}$ total atoms of the one or more noble elements. In one embodiment, lower material 32 comprises 0.1 total atomic percent to 4 total atomic percent of the one or more noble elements (in one embodiment no more than $1 \times 10^{-6}$ total atoms of the one or more noble elements) and in one embodiment comprises 0 atomic percent to no more than $1 \times 10^{-6}$ total atoms of elemental-form H. Any other attribute(s) or aspect(s) as shown and/or described herein with respect to other embodiments may be used.

In one embodiment, upper material 30 comprises 0 atomic percent to less than 1 atomic percent elemental-form H and 0 total atomic percent to less than 0.1 total atomic percent of one or more noble elements, and lower material 32 comprises 0 atomic percent to less than 1 atomic percent elemental-form H and 0.1 total atomic percent to 10 total atomic percent of one or more noble elements. In one such embodiment, upper material 30 comprises 0 atomic percent to no more than $1 \times 10^{-6}$ total atoms of the elemental-form H and in one embodiment comprises 0 total atomic percent to no more than $1 \times 10^{-6}$ total atoms of the one or more noble elements. In one embodiment, lower material 32 comprises 0 atomic percent to no more than $1 \times 10^{-6}$ total atoms of the elemental-form H and in one embodiment comprises 0.1 total atomic percent to 4 total atomic percent of the one or more noble elements (in one embodiment no more than $1 \times 10^{-6}$ total atoms of the one or more noble elements). Any other attribute(s) or aspect(s) as shown and/or described herein with respect to other embodiments may be used.

In one embodiment, upper material 30 comprises 0 atomic percent to less than 1 atomic percent elemental-form H and 0.1 total atomic percent to 10 total atomic percent of one or more noble elements, and lower material 32 comprises 1 atomic percent to 10 atomic percent elemental-form H and 0 total atomic percent to less than 0.1 total atomic percent of one or more noble elements. In one such embodiment, upper material 30 comprises 0 atomic percent to no more than $1 \times 10^{-6}$ total atoms of the elemental-form H and in one embodiment comprises 0.1 total atomic percent to 4 total atomic percent of the one or more noble elements (in one embodiment no more than $1 \times 10^{-6}$ total atoms of the one or more noble elements). In one embodiment, lower material 32 comprises 1 atomic percent to 4 atomic percent elemental-form H (in one embodiment no more than $1 \times 10^{-6}$ total atoms of the elemental-form H) and in one embodiment comprises 0 total atomic percent to no more than $1 \times 10^{-6}$ total atoms of the one or more noble elements. Any other attribute(s) or aspect(s) as shown and/or described herein with respect to other embodiments may be used.

Quantities of elemental-form H and quantities of the one or more noble elements may be used to modify conductivity of upper material 30 and/or lower material 32 having conductivity-modifying dopant therein and/or may be an artifact of manufacture.

Embodiments of the invention encompass methods as well as a transistor as identified above independent of method of manufacture. Nevertheless, such methods may have any of the attributes as described above in structure embodiments. Likewise, the above-described structure embodiments may incorporate and form any of the attributes described below with respect to method embodiments. Example methods may be used in forming at least a portion of a vertical transistor, the portion comprising at least part of a top source/drain region, at least part of a bottom source/drain region, or at least part of a channel region that is vertically between the top and bottom source/drain regions. Example methods include forming a lower material (e.g., 32) above a substrate (e.g., 11), with the lower material being amorphous to up to 20% by volume crystalline. In this document, "amorphous" not immediately preceded by a numerical percentage or other quantifying adjective(s) is a material, region, and/or structure that is at least 90% by volume amorphous. An upper material (e.g., 30) is formed atop (and ideally directly against) the lower material and is also amorphous to up to 20% by volume crystalline. Materials 30 and 32 may be formed using the same technique (e.g., physical vapor deposition, chemical vapor deposition, atomic layer deposition, etc.) or using different such or other techniques. Ideally, each of materials 30 and 32 is entirely amorphous. Regardless, the upper and lower materials are annealed to each be crystalline, and ideally to entirely crystalline.

In one embodiment, the annealing of the upper material and the annealing of the lower material occurs at the same time. In another embodiment, the annealing of the upper and the annealing of the lower materials occur at different time-spaced periods of time. In one embodiment, the annealing of at least one of the upper material and the lower material comprises laser annealing. By way of examples only, laser annealing may use a wavelength between 200 and 700 nanometers, power at 0.1 to 2 $J/cm^2$ (ideally, 0.5 to 2 $J/cm^2$), pulse width 5 to 250 nanoseconds, number of laser shots 1 to 100, and substrate temperature from room temperature to 450° C. Laser power for any anneal can be varied as selected by the artisan to control surface roughness of interfaces and grain size of the layer(s) being laser annealed. Additionally, substrate temperature may be varied for different laser shots, as may laser power and/or pulse width. The laser annealing may render the material that is annealed to be molten. Any material(s) being laser annealed immediately-prior to such laser annealing may doped to different concentrations. Regardless, in one embodiment, the annealing activates conductivity-increasing dopant present in the upper and lower materials. In one embodiment, the lower material is formed at a lower maximum temperature than at which the upper material is formed. In one embodiment, the lower material is formed by physical vapor deposition and the upper material is formed by chemical vapor deposition.

In one embodiment, upper material 30 is formed to comprises 1 atomic percent to 10 atomic percent elemental-form H and 0 total atomic percent to less than 0.1 total atomic percent of one or more noble elements, and lower material 32 comprises 0 atomic percent to less than 1 atomic percent elemental-form H and 0.1 total atomic percent to 10 total atomic percent of one or more noble elements. Any other attribute(s) or aspect(s) as shown and/or described herein with respect to other embodiments may be used.

In one embodiment, upper material 30 comprises 0 atomic percent to less than 1 atomic percent elemental-form H and 0 total atomic percent to less than 0.1 total atomic percent of one or more noble elements, and lower material 32 comprises 0 atomic percent to less than 1 atomic percent elemental-form H and 0.1 total atomic percent to 10 total atomic percent of one or more noble elements. Any other attribute(s) or aspect(s) as shown and/or described herein with respect to other embodiments may be used.

In one embodiment, upper material 30 comprises 0 atomic percent to less than 1 atomic percent elemental-form H and 0.1 total atomic percent to 10 total atomic percent of one or more noble elements, and lower material 32 comprises 1 atomic percent to 10 atomic percent elemental-form H and 0 total atomic percent to less than 0.1 total atomic percent of one or more noble elements. Any other attribute(s) or aspect(s) as shown and/or described herein with respect to other embodiments may be used.

One or more method embodiments of the invention were motivated by a desire to fabricate vertical transistors at lower temperatures (e.g., below 500° C.) and at a low or lower thermal budget. Such may be significant in the fabrication of integrated circuitry that forms multiple decks of circuitry atop one another wherein processing of a higher deck should not cause melting or other adverse phenomenon in the deck or decks below the higher deck. Thermal budget constraints can limit allowable deposition temperatures and time at temperature (e.g., less than 1 minute at 500° C. and less than 60 minutes at 450° C.). Further, rates of deposition at lower temperatures can be to low to preclude adequate deposition before exceeding thermal budget.

Plasma enhanced chemical vapor deposition, as opposed to thermal chemical vapor deposition, also is one technique by which lower deposition temperatures may be achieved. Elemental-form silicon is a common desirable primary material of vertical and other transistors. Such may be deposited using a silane (a material containing both silicon and hydrogen), such as a monosilane, a disilane, a trisilane, a tetrasilane, or neopentasilane. Plasma enhanced chemical vapor deposition using silanes can result in elemental-form hydrogen being incorporated in the deposited layer. Further, hydrogen presence in a resulting silicon-comprising layer adversely impacts adhesion of the deposited layer to underlying substrate material. Lower hydrogen content (e.g., less than 1 atomic percent) in a lower material in accordance with some embodiments of the invention may improve adhesion to underlying materials.

Physical vapor deposition is another technique by which materials may be deposited onto a substrate at desired lower temperatures, although such deposited materials may have less-desirable structural properties as compared to materials deposited using plasma enhanced chemical vapor deposition. Physical deposition uses a target that is substantially composed of the desired material to be deposited. The target is physically bombarded (e.g., sputtered) with one or more noble gases that physically dislodges the target material causing it to be physically deposited onto a substrate that is positioned adjacent the target. Some of the noble gas (i.e., noble element(s)) may be incorporated in the material that is physically deposited onto the substrate. Noble element incorporation into physical-vapor-deposited layers may undesirably create void spaces in upper portions of the layers in comparison to lower portions thereof, which may be detrimental. Accordingly, and in perhaps some embodiments, deposited layers having less noble element(s) in outermost portions thereof in comparison to lower portions thereof may reduce void formation.

In some embodiments, presence of one or more noble elements and/or elemental-form hydrogen may preclude undesired dopant diffusion among and/or within different regions of the substrate and, for example, may facilitate achieving very low or un-doped channel regions when desired.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a transistor comprises a top source/drain region, a bottom source/drain region, a channel region vertically between the top and bottom source/drain regions, and a gate operatively laterally-adjacent the channel region. An upper material is directly above a lower material. The upper material is in at least one of the top source/drain region, the bottom source/drain region, and the channel region. The lower material is in at least one of the top source/drain region, the bottom source/drain region, and the channel region. The upper material comprises 1 atomic percent to 10 atomic percent elemental-form H and 0 total atomic percent to less than 0.1 total atomic percent of one or more noble elements. The lower material comprises 0 atomic percent to less than 1 atomic percent elemental-form H and 0.1 total atomic percent to 10 total atomic percent of one or more noble elements.

In some embodiments, a transistor comprises a top source/drain region, a bottom source/drain region, a channel region vertically between the top and bottom source/drain regions, and a gate operatively laterally-adjacent the channel region. An upper material is directly above a lower material. The upper material is in at least one of the top source/drain region, the bottom source/drain region, and the channel region. The lower material is in at least one of the top source/drain region, the bottom source/drain region, and the channel region. The upper material comprises 0 atomic percent to less than 1 atomic percent elemental-form H, and 0 total atomic percent to less than 0.1 total atomic percent of one or more noble elements. The lower material comprises 0 atomic percent to less than 1 atomic percent elemental-form H and 0.1 total atomic percent to 10 total atomic percent of one or more noble elements.

In some embodiments, a transistor comprises a top source/drain region, a bottom source/drain region, a channel region vertically between the top and bottom source/drain regions, and a gate operatively laterally-adjacent the channel region. An upper material is directly above a lower material. The upper material is in at least one of the top source/drain region, the bottom source/drain region, and the channel region. The lower material is in at least one of the top source/drain region, the bottom source/drain region, and the channel region. The upper material comprises 0 atomic percent to less than 1 atomic percent elemental-form H and 0.1 total atomic percent to 10 total atomic percent of one or more noble elements. The lower material comprises 1 atomic percent to 10 atomic percent elemental-form H and 0 total atomic percent to less than 0.1 total atomic percent of one or more noble elements.

In some embodiments, a method is used in forming at least a portion of a vertical transistor, with the portion comprising at least part of a top source/drain region, at least part of a bottom source/drain region, or at least part of a channel region vertically between the top and bottom source/drain regions. The method comprises forming a lower material above a substrate, with the lower material being amorphous to up to 20% by volume crystalline. The lower material comprises 0 atomic percent to less than 1 atomic percent elemental-form H and 0.1 total atomic percent to 10 total atomic percent of one or more noble elements. An upper material is formed atop the lower material. The upper material is amorphous to up to 20% by volume crystalline. The upper material comprises 1 atomic percent to 10 atomic percent elemental-form H and 0 total atomic percent to less than 0.1 total atomic percent of one or more noble elements. The upper and lower materials are annealed to each be crystalline.

In some embodiments, a method is used in forming at least a portion of a vertical transistor, with the portion comprising at least part of a top source/drain region, at least part of a bottom source/drain region, or at least part of a channel region vertically between the top and bottom source/drain regions. The method comprises forming a lower material above a substrate, with the lower material being amorphous to up to 20% by volume crystalline. The lower material comprises 0 atomic percent to less than 1 atomic percent elemental-form H and 0.1 total atomic percent to 10 total atomic percent of one or more noble elements. An upper material is formed atop the lower material. The upper material is amorphous to up to 20% by volume crystalline. The upper material comprises 0 atomic percent to less than 1 atomic percent elemental-form H and 0 total atomic percent to less than 0.1 total atomic percent of one or more noble elements. The upper and lower materials are annealed to each be crystalline.

In some embodiments, a method is used in forming at least a portion of a vertical transistor, with the portion comprising at least part of a top source/drain region, at least part of a bottom source/drain region, or at least part of a channel region vertically between the top and bottom source/drain regions. The method comprises forming a lower material above a substrate, with the lower material being amorphous to up to 20% by volume crystalline. The lower material comprises 1 atomic percent to 10 atomic percent elemental-form H and 0 total atomic percent to less than 0.1 total atomic percent of one or more noble elements. An upper material is formed atop the lower material. The upper material is amorphous to up to 20% by volume crystalline. The upper material comprises 0 atomic percent to less than 1 atomic percent elemental-form H and 0.1 total atomic percent to 10 total atomic percent of one or more noble elements. The upper and lower materials are annealed to each be crystalline.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A transistor comprising:
   an upper material comprising:
      1 atomic percent to 10 atomic percent elemental-form H; and
      0 total atomic percent to less than 0.1 total atomic percent of one or more noble elements;
   a lower material directly below the upper material, comprising:
      0 atomic percent to less than 1 atomic percent elemental-form H; and
      0.1 total atomic percent to 10 total atomic percent of one or more noble elements;
   at least one of a top source/drain region, a bottom source/drain region, and a channel region of the transistor comprising the upper material and at least one of the top source/drain region, the bottom source/drain region, and the channel region comprising the lower material; and
   a gate operatively laterally-adjacent the channel region.

2. The transistor of claim 1 wherein the upper material is directly against the lower material.

3. The transistor of claim 1 wherein the upper material comprises 1 atomic percent to 4 atomic percent elemental-form H.

4. The transistor of claim 1 wherein the lower material comprises 0.1 total atomic percent to 4 total atomic percent of the one or more noble elements.

5. The transistor of claim 1 wherein the upper material comprises 0 total atomic percent to no more than $1\times10^{-6}$ total atoms of the one or more noble elements.

6. The transistor of claim 1 wherein the lower material comprises 0 atomic percent to no more than $1\times10^{-6}$ total atoms of the elemental-form H.

7. The transistor of claim 1 wherein the upper and lower materials are in the same one of the top source/drain region, the bottom source/drain region, and the channel region.

8. The transistor of claim 7 wherein the upper and lower materials are in the top source/drain region.

9. The transistor of claim 7 wherein the upper and lower materials are in the channel region.

10. The transistor of claim 7 wherein the upper and lower materials are in the bottom source/drain region.

11. The transistor of claim 1 wherein the upper and lower materials are in different ones of the top source/drain region, the bottom source/drain region, and the channel region.

12. The transistor of claim 11 wherein,
    the upper material is directly against the lower material;
    the upper material is in a bottom of the top/source drain region; and
    the lower material is in a top of the channel region.

13. The transistor of claim 12 wherein,
    the upper material is directly against the lower material;
    the upper material is in a bottom of the channel region; and
    the lower material is in a top of the bottom source/drain region.

14. The transistor of claim 1 wherein each of the upper and lower materials has a maximum thickness of 50 Angstroms to 2,000 Angstroms.

15. The transistor of claim 1 wherein the lower material has a lower maximum thickness than the upper material.

16. A transistor comprising:
    an upper material comprising:
       0 atomic percent to less than 1 atomic percent elemental-form H; and
       0 total atomic percent to less than 0.1 total atomic percent of one or more noble elements; and
    a lower material directly below the upper material, comprising:
       0 atomic percent to less than 1 atomic percent elemental-form H; and
       0.1 total atomic percent to 10 total atomic percent of one or more noble elements;
    at least one of a top source/drain region, a bottom source/drain region, and a channel region of the transistor comprising the upper material and at least one of the top source/drain region, the bottom source/drain region, and the channel region comprising the lower material; and
    a gate operatively laterally-adjacent the channel region.

17. The transistor of claim 16 wherein the upper material is directly against the lower material.

18. A transistor comprising:
    an upper material comprising:
       0 atomic percent to less than 1 atomic percent elemental-form H; and
       0.1 total atomic percent to 10 total atomic percent of one or more noble elements; and
    a lower material directly below the upper material, comprising:

1 atomic percent to 10 atomic percent elemental-form H; and 0 total atomic percent to less than 0.1 total atomic percent of one or more noble elements;

at least one of a top source/drain region, a bottom source/drain region, and a channel region of the transistor comprising the upper material and at least one of the top source/drain region, the bottom source/drain region, and the channel region comprising the lower material; and a gate operatively laterally-adjacent the channel region.

19. The transistor of claim 18 wherein the upper material is directly against the lower material.

20. A method used in forming at least a portion of a vertical transistor, the portion comprising at least part of a top source/drain region, at least part of a bottom source/drain region, or at least part of a channel region vertically between the top and bottom source/drain regions, comprising:

forming a lower material above a substrate, the lower material being amorphous to up to 20% by volume crystalline, the lower material comprising:

0 atomic percent to less than 1 atomic percent elemental-form H; and 0.1 total atomic percent to 10 total atomic percent of one or more noble elements;

forming an upper material atop the lower material, the upper material being amorphous to up to 20% by volume crystalline, the upper material comprising:

1 atomic percent to 10 atomic percent elemental-form H; and 0 total atomic percent to less than 0.1 total atomic percent of one or more noble elements; and annealing the upper and lower materials to each be crystalline.

21. The method of claim 20 wherein the upper material is formed directly against the lower material.

22. The method of claim 20 wherein the annealing of the upper material and the annealing of the lower material occurs at the same time.

23. The method of claim 20 wherein the annealing of the upper and the annealing of the lower material occur at different time-spaced periods of time.

24. The method of claim 20 wherein the annealing of at least one of the upper material and the lower material comprises laser annealing.

25. The method of claim 20 wherein the annealing activates conductivity-increasing dopant in the upper and lower materials.

26. The method of claim 20 wherein the lower material is formed at a lower maximum temperature than at which the upper material is formed.

27. The method of claim 20 wherein the lower material is formed by physical vapor deposition and the upper material is formed by chemical vapor deposition.

28. A method used in forming at least a portion of a vertical transistor, the portion comprising at least part of a top source/drain region, at least part of a bottom source/drain region, or at least part of a channel region vertically between the top and bottom source/drain regions, comprising:

forming a lower material above a substrate, the lower material being amorphous to up to 20% by volume crystalline, the lower material comprising:

0 atomic percent to less than 1 atomic percent elemental-form H; and 0.1 total atomic percent to 10 total atomic percent of one or more noble elements;

forming an upper material atop the lower material, the upper material being amorphous to up to 20% by volume crystalline, the upper material comprising:

0 atomic percent to less than 1 atomic percent elemental-form H; and 0 total atomic percent to less than 0.1 total atomic percent of one or more noble elements; and annealing the upper and lower materials to each be crystalline.

29. The method of claim 28 wherein the upper material is formed directly against the lower material.

30. A method used in forming at least a portion of a vertical transistor, the portion comprising at least part of a top source/drain region, at least part of a bottom source/drain region, or at least part of a channel region vertically between the top and bottom source/drain regions, comprising:

forming a lower material above a substrate, the lower material being amorphous to up to 20% by volume crystalline, the lower material comprising:

1 atomic percent to 10 atomic percent elemental-form H; and 0 total atomic percent to less than 0.1 total atomic percent of one or more noble elements;

forming an upper material atop the lower material, the upper material being amorphous to up to 20% by volume crystalline, the upper material comprising:

0 atomic percent to less than 1 atomic percent elemental-form H; and 0.1 total atomic percent to 10 total atomic percent of one or more noble elements; and annealing the upper and lower materials to each be crystalline.

31. The method of claim 30 wherein the upper material is formed directly against the lower material.

* * * * *